United States Patent [19]

Williams et al.

[11] 4,455,742
[45] Jun. 26, 1984

[54] METHOD OF MAKING SELF-ALIGNED MEMORY MNOS-TRANSISTOR

[75] Inventors: David W. Williams, Baltimore; James R. Cricchi, Catonsville, both of Md.

[73] Assignee: Westinghouse Electric Corp., Pittsburgh, Pa.

[21] Appl. No.: 385,200

[22] Filed: Jun. 7, 1982

[51] Int. Cl.³ ...................... H01L 27/02; H01L 21/26
[52] U.S. Cl. ................................. 29/576 B; 29/571; 148/1.5; 148/187; 357/23; 357/91
[58] Field of Search .................. 148/1.5, 187; 29/571, 29/576 B; 357/23 VT, 91

[56] References Cited

U.S. PATENT DOCUMENTS

| | | | |
|---|---|---|---|
| 3,719,866 | 3/1973 | Naber et al. | 317/235 R |
| 3,925,804 | 12/1975 | Cricchi et al. | 357/23 |
| 4,053,917 | 10/1977 | Blaha et al. | 357/78 |
| 4,057,820 | 11/1977 | Gallagher | 357/23 |
| 4,098,924 | 7/1978 | McLouski et al. | 427/93 |
| 4,101,921 | 7/1978 | Shimada et al. | 357/23 VT |
| 4,112,507 | 9/1978 | White et al. | 365/184 |
| 4,151,538 | 4/1979 | Polinsky | 357/23 VT |
| 4,197,630 | 4/1980 | Kamprath | 29/571 |
| 4,198,252 | 4/1980 | Hsu | 148/187 |
| 4,229,755 | 10/1980 | Custode | 357/23 VT |
| 4,305,086 | 12/1981 | Khajezadeh | 357/23 VT |

Primary Examiner—Upendra Roy
Attorney, Agent, or Firm—R. M. Trepp

[57] ABSTRACT

A method is described for positioning the variable threshold region of a memory transistor by a predetermined distance from the drain and source regions. The method includes providing openings in the dielectric material over the substrate at the same time or in one mask step for the variable threshold region and the drain and source regions. A mask is positioned over the variable threshold region opening at times the drain and source regions are formed. The variable threshold region is subsequently formed by growing thin oxide and a layer of nitride thereover. Both sides of the variable threshold region have a fixed threshold region between the respective drain and source which is controlled by a common gate electrode. The invention overcomes the problem of providing additional space for alignment tolerances between the variable threshold region and the drain and source regions.

21 Claims, 22 Drawing Figures

[4,455,742]

METHOD OF MAKING SELF-ALIGNED MEMORY MNOS-TRANSISTOR

BACKGROUND OF THE INVENTION

1. Field of the Invention

This invention relates to semiconductor memory devices and more particularly to a technique for self-aligning the gate region between the drain and source of a field effect transistor.

2. Description of the Prior Art

In the fabrication of metal nitride oxide semiconductor (MNOS) transistors a variable threshold gate region is located between two fixed threshold gate regions. The three gate regions are between the drain and source of the transistor. The density of an array of MNOS transistors is limited by the drain to source spacing of each transistor which as previously mentioned contains a fixed threshold region, a variable threshold region and a second fixed threshold region. Using present processing techniques, a 1.5 micrometer side diffusion occurs during diffusion of a 4 micrometer wide P+ stripe for each of the drain and source regions of one or more transistors which are formed in parallel therebetween. A 1 micrometer alignment tolerance occurs between the several masks used in the process steps. The 1 micrometer alignment tolerance and the side diffusion of 1.5 micrometers reduce the space between the drain and source for the first fixed threshold region, the variable threshold region and the second fixed threshold region from 14 micrometers to 9 micrometers. With a variable threshold region space of 5 micrometers the space between the variable threshold region to either the drain or source could be reduced from 4.5 micrometers to 2 micrometers. This is the channel length for the fixed threshold regions or non-memory regions. Present photo engraving techniques allow for a drain and source minimum width of 4 micrometers comprised of P+ material in an N-type substrate and a variable threshold region of 5 micrometers in width.

A transistor having a fixed threshold region followed by a variable threshold region followed by a fixed threshold region was described and shown in FIG. 3 in U.S. Pat. No. 3,719,866 which issued on Mar. 6, 1973 to C. T. Naber and G. C. Lockwood and assigned to the National Cash Register Company of Dayton, Ohio.

In U.S. Pat. No. 4,053,917 which issued on Oct. 11, 1977 to F. C. Blaha, J. R. Cricchi and M. H. White and assigned to the United States of America, a drain source protected MNOS transistor is described wherein the fixed threshold regions have their gate oxide grown subsequent to the formation of the gate oxide and nitride region of the variable threshold transistor. The gate oxide of the fixed threshold regions are grown concurrently on either side of the variable threshold region to the drain and source respectively. In U.S. Pat. No. 4,053,917 the gate region of the fixed and variable threshold regions are not self-aligned with the drain and source regions.

It is therefore desirable to provide a drain source protected MNOS memory having the drain and source regions and the variable threshold region aligned with respect to each other.

It is further desirable to provide a process for making high density variable threshold transistors.

It is further desirable to use ion implantation to form the source and drain regions and at the same time to self-align the variable threshold portion of the memory transistor.

It is further desirable to provide diffused drain and source regions while at the same time having a self-aligned variable threshold transistor region between the drain and source regions of the memory transistor.

SUMMARY OF THE INVENTION

In accordance with the present invention, a method is provided for self-aligning the variable threshold region between the drain and source of a memory transistor comprising the steps of depositing a layer of oxide over a semiconductor substrate of silicon, depositing a layer of silicon nitride over the layer of silicon oxide, etching windows through the silicon nitride and silicon oxide for the drain, source and variable threshold regions of the transistor, depositing material suitable to form an implant barrier over the variable threshold region, ion implanting impurities through the openings in the semiconductor substrate to form the drain and source regions, removing the material forming the implant barrier from above the variable threshold region, growing thermal oxide in the variable threshold region, depositing silicon nitride over the wafer, opening contact windows to the drain and source regions, depositing metal over the wafer, and etching the metal to form drain and source contacts and a gate electrode.

A variation of the above process is to remove or strip the silicon nitride prior to depositing fresh silicon nitride. Also, prior to opening contact windows, depositing silicon oxide over the silicon nitride, and selectively removing portions of the silicon oxide to form a mask.

The invention further provides a method for providing a self-aligned variable threshold region between the drain and source of the memory transistor comprising the steps of: depositing silicon nitride over a silicon wafer, etching the nitride to leave regions of silicon nitride over the area desired for the drain, source and variable threshold region of the memory transistor, forming oxide over the wafer in areas not masked by the silicon nitride, depositing photoresist over a selected silicon nitride region to be the variable threshold region, removing the silicon nitride over the drain and source regions, removing the photoresist over the variable threshold region, diffusing P+ impurities into the drain and source regions, oxidizing the regions above the drain and source regions, removing the silicon nitride over the variable threshold region, growing a thin layer of oxide in the variable threshold region, depositing a layer of silicon nitride over the wafer, opening up windows for contact to the drain and source regions, depositing metallization over the wafer, and etching the metal to form drain and source contacts and a gate electrode.

DESCRIPTION OF THE PREFERRED EMBODIMENT

Figure 1:
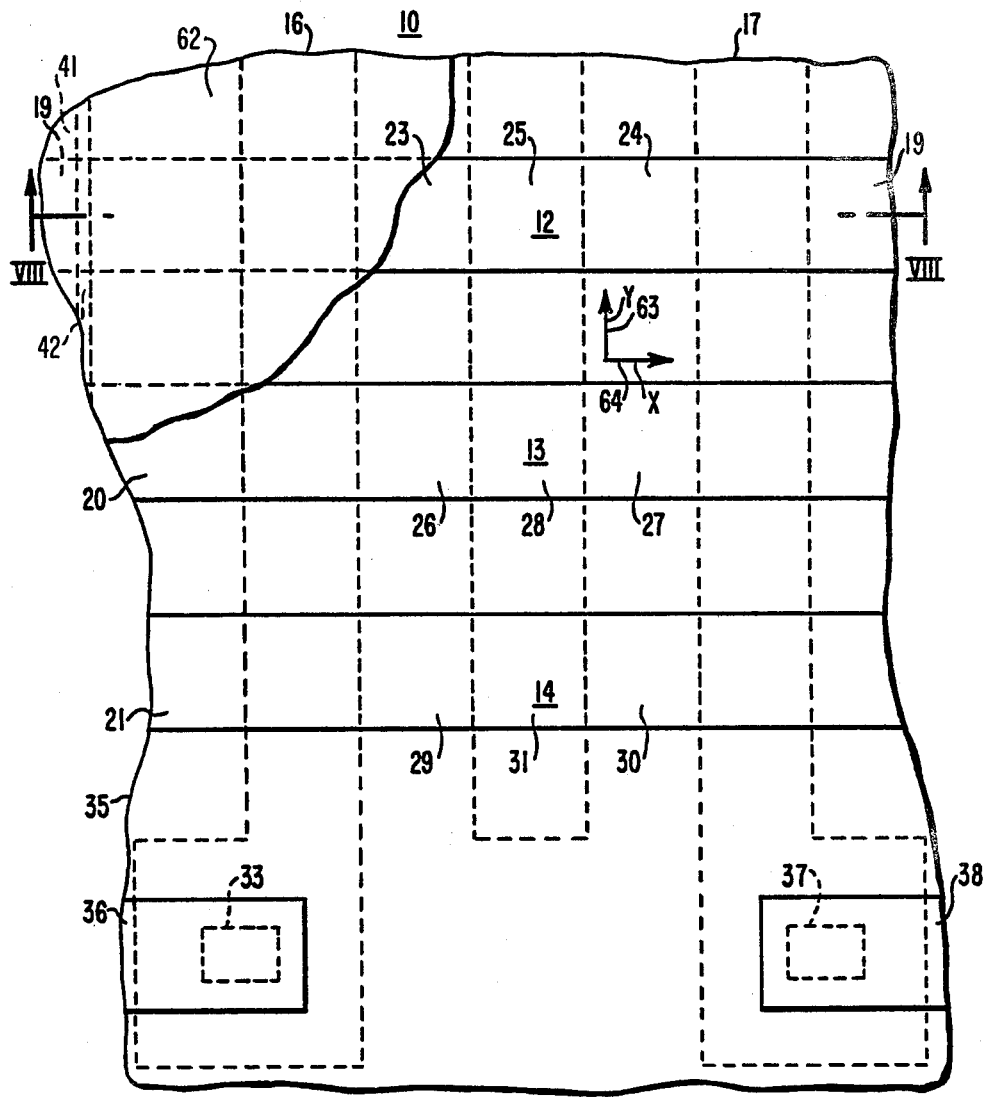
FIG. 1 is a top view of an array of variable threshold transistors.

Referring to FIG. 1 a plan view of a portion of memory array 10 is shown wherein the memory elements are a plurality of metal nitride oxide semiconductor (MNOS) transistors 12 through 14. Each transistor 12 through 14 has a drain and source region which may be interchangeable. The drain and source regions are formed by P+ ion implantations 16 and 17. P+ ion implantations 16 and 17, for example, each have a uniform width such as 4 micrometers and are spaced apart from each other by a predetermined distance such as 9 micrometers. The length of P+ ion implantations 16 and 17 may run parallel to one another and allows a plurality of MNOS transistors to be formed therebetween. Transverse to P+ ion implantations 16 and 17 are conductive strips 19-21 which form the gate electrodes of transistors 12-14. Conductive strips 19-21 may for example be comprised of polycrystalline silicon material or of a metallization such as aluminum.

Between the drain and source regions 16 and 17 and underneath gate electrode 19 of transistor 12 are fixed threshold regions 23 and 24 which are spaced apart by a variable threshold region 25. Between the drain and source regions 16 and 17 and underneath gate electrode 20 of transistor 13 are fixed threshold regions 26 and 27 which are spaced apart by a variable threshold region 28 therebetween. Between the drain and source regions 16 and 17 and underneath gate electrode 21 of transistor 14 are fixed threshold regions 29 and 30 which are spaced apart by a variable threshold region 31 therebetween. Ohmic contact to P+ ion implantations 16 may be made by opening 33 through the dielectric material, silicon nitride layer 61 and silicon oxide 57 or 59 to the semiconductor substrate 35. A conductive material such as aluminum may form the drain contact 36 which provides electrical contact to drain region 16. Window 37 allows source contact 38 which may for example be aluminum to make ohmic contact with source region 17.

Figure 8:
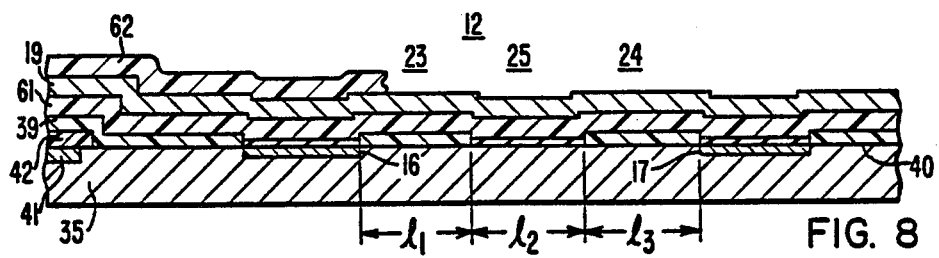
FIGS. 2–8 are cross-section views along the lines VIII—VIII of FIG. 1 during the method steps of this invention.

FIGS. 2-7 show progressive steps performed in the fabrication of the memory array 10 in FIG. 1 which results in a self-aligned variable threshold region between the drain and source of each memory transistor. FIG. 8 shows a cross-section view along the lines VIII—VIII of FIG. 1 illustrating the structure of each memory transistor upon completion of the processing steps.

Figure 2:
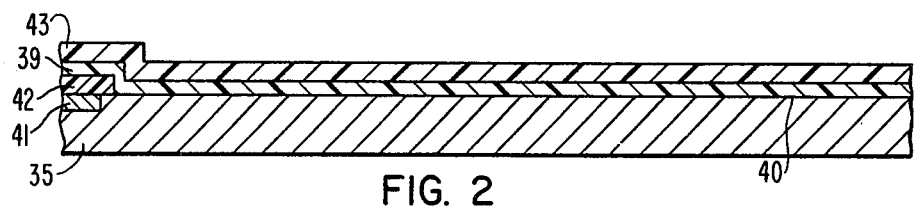

Referring to FIGS. 1 and 2, semiconductor substrate 35 which may be N-type silicon has a field implant 41 of N type material in substrate 35 in selected areas around memory array 10. The field implant which may be formed by suitable masking and ion implantation or diffusion has the effect of raising the threshold voltage $V_T$ of substrate 35 in the region of field implant 41. The higher threshold voltage prevents inversion layers from being formed in substrate 35 when signal and voltage lines are routed above. A field oxide 42 is formed above field implant 41 having a thickness of 8,000 to 10,000 Angstroms. The field oxide 42 is formed in the selected areas using suitable masking techniques well known in the art.

In the region of memory array 10, substrate 35 has a layer of silicon oxide 39 formed on the upper surface 40 of substrate 35. Silicon oxide layer 39 may, for example, be 800 Angstroms thick and may be formed by oxidizing the semiconductor material, known as thermal oxide, to form the dielectric material below the gate electrode. A layer of silicon nitride 43 is deposited over silicon oxide layer 39 and has a thickness of approximately 2,000 Angstroms. Silicon oxide layer 39 and silicon nitride layer 43 may be deposited by standard processes well known in the semiconductor industry.

Figure 3:
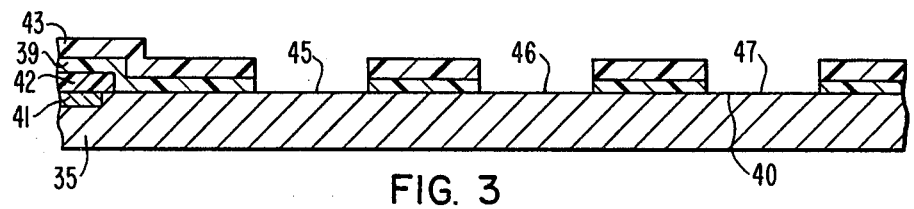

FIG. 3 shows openings 45-47 made through silicon nitride layer 43 and silicon dioxide layer 39 to the upper surface 40 of semiconductor substrate 35. The openings 45-47 may be made by depositing a photoresist over silicon nitride layer 43 and selectively removing portions of the photoresist where openings 45-47 are desired, followed by etching through silicon nitride layer 43 and silicon dioxide layer 39 using suitable etchants to expose upper surface 40. The photoresist (not shown) is subsequently removed. Openings 45-47 may, for example, be long rectangular openings, strips or slots.

With openings 45-47, the drain may be formed under opening 45 and the source under 47. Opening 46 may be the location of the variable threshold gate region 25 shown in FIG. 1 which is self-aligned with respect to openings 45 and 47 since they were all made with the same photolithic mask. The relationship of openings 45-47 through subsequent processing are maintained to result in a memory transistor having a variable threshold region which is self-aligned with respect to the drain and source.

Figure 4:
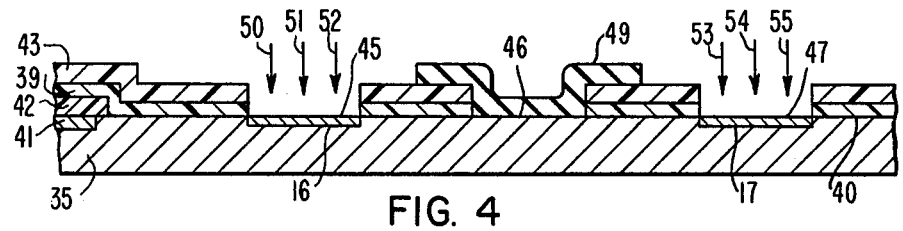

Referring to FIG. 4, photoresist or protective mask 49 is deposited or formed over opening 46 while openings 45 and 47 are left exposed without any photoresist 49. As shown in FIG. 4, P-type impurities indicated by arrows 50-55 are ion implanted into substrate 35 through openings 45 and 47 to form P+ regions 16 and 17. It is understood that photoresist 49 may be of some other material selectively deposited such as polyimide material. Photoresist 49 functions to form an implant barrier to prevent P-type impurties from passing therethrough into the semiconductor substrate 35 in the region below opening 46.

Figure 5:
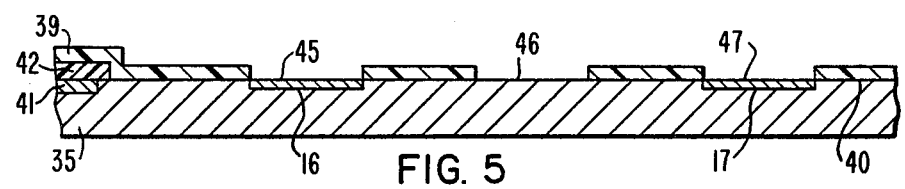

The photoresist 49 is then removed from above opening 46 and silicon nitride layer 43 is removed as shown in FIG. 5. Silicon nitride layer 43 may be removed such as by using a suitable etchant to provide the structure shown in FIG. 5.

Figure 6:
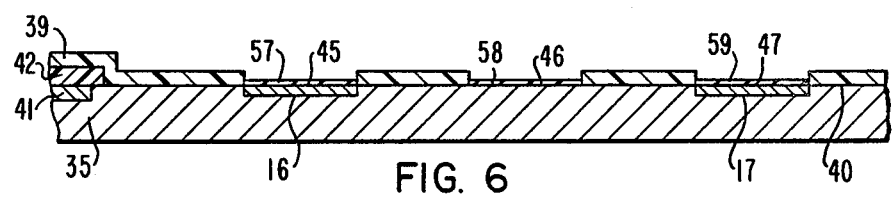

An oxide such as a thermal oxide 58 may be grown on upper surface 40 in opening 46 which is thin on the order from 20-400 Angstroms thick to provide variable threshold characteristics in transistor 12. The thermal oxide 57 and 59 may at the same time be grown in upper surface 40 at openings 45 and 47 respectively as shown in FIG. 6.

Figure 7:
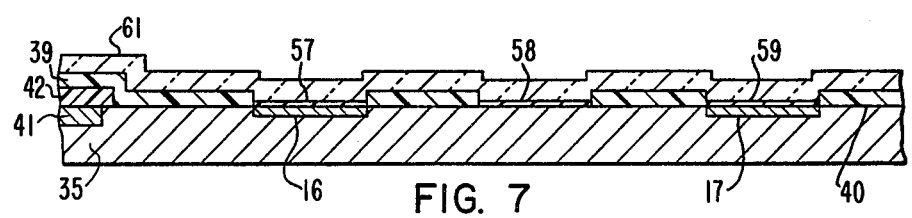

Referring to FIG. 7 a silicon nitride layer 61 is deposited over silicon oxide layer 39 and thermal oxide 57-59. Silicon nitride layer 61 is deposited to a suitable thickness so that a variable threshold device may be formed in the region over thermal oxide 58 while fixed threshold regions are formed where silicon nitride layer 61 overlays silicon oxide layer 39 due to the thickness of layer 39.

Referring to FIG. 1 openings 33 and 37 are formed through silicon nitride layer 61 and silicon oxide 57 and 59 to expose the upper surface 40 in the area where P+ ion implantation 16 and 17 have been formed. Conductive material such as aluminum or polysilicon is deposited over silicon nitride layer 61 and openings 33 and 37. The conductive material is subsequently etched using a suitable mask and photoresist to form gate electrodes 19-21 and drain and source contacts 36 and 38.

A layer 62 of dielectric material is deposited over silicon nitride layer 61 and gate electrodes 19-21. Layer 62 is formed using a low temperature process so as not to disturb the metallization or performance of the MNOS transistors. Layer 62 may be formed by the chemical vapor deposition of silicon oxide known as SILOX. Layer 62 functions to form a conformal coating over memory array 10 and especially to fill the spaces between the gate electrodes 19-21. As an aid in filling the spaces between the gate electrodes 19-21, prior to depositing conductive material, a layer of silicon oxide may be deposited. Portions of the silicon oxide in the gate region may be removed. The gate electrode will then be deposited and silicon oxide will be in place between the electrodes. A subsequent layer of oxide may be deposited over the electrode to protect it as a conformed coating.

Referring to FIG. 8 a cross-section view along the lines VIII—VIII of FIG. 1 shows memory transistor 12 having a drain 16 and a source 17 with a variable threshold region 25 having a channel length $l_2$ self-aligned with respect to drain 16 and source 17. The regions 16, 17 and 25 were aligned with respect to one another at the time openings 45-47 were formed as shown in FIG. 3. On either side of region 25 are regions 23 and 24 which are fixed threshold regions. The self-aligned region 25 permits minimum spacing or length of each region 23 and 24. Region 25 may for example have a channel length $l_2$ of 5 micrometers long. Regions 23 and 24 may be of minimum channel length $l_1$ and $l_3$, respectively, which may be, for example, 2 micrometers for $l_1$ or for $l_3$ when the alignment tolerance between masks is 1 micrometer. The minimum channel length of regions 23 and 24 permit the drain and source to be closer together thereby permitting a smaller spacing between the drain and source made up of $l_1$, $l_2$ and $l_3$ enabling higher density memories to be fabricated.

In the embodiment of FIG. 1 transistors 12-14 are shown as a portion of memory array 10. Memory array 10 may for example contain 16,384 bits with 2 transistors per bit arranged as 256 rows by 128 columns. Transistors 12-14 shown in memory array 10 of FIG. 1 may be repeated along the columns and rows in the Y and X directions respectively shown by arrows 63 and 64. For example, drain region 16 may act as a drain for a column of memory transistors on its left as well as memory transistors 12-14 on its right. Likewise source region 17 may act as the source for memory transistors on its right as well as memory transistors 12-14 on its left. Each row of memory array 10 may be delineated by a gate electrode which extends across all transistors in a row such as gate electrode 19.

Figure 9:
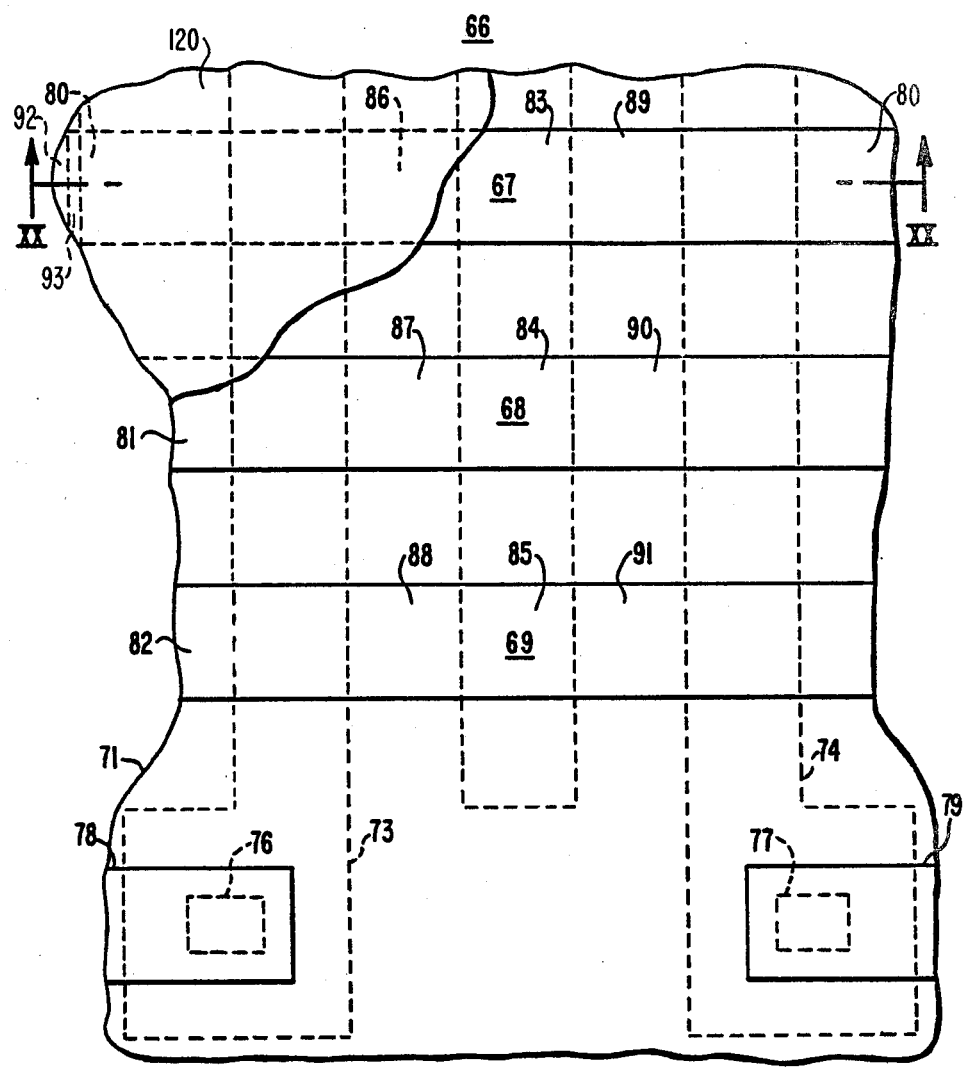
FIG. 9 is a top view of an array of variable threshold transistors.

Referring to FIG. 9 memory array 66 is shown having memory transistors 67-69 which may be for example metal nitride oxide semiconductor (MNOS) transistors. Memory array 66 is formed on a semiconductor substrate 71 which may be for example be N-type. P+ regions 73 and 74 may form the drain and source of transistors 67-69. It is understood that the drain and source of memory transistors 67-69 may be interchangeable. Openings 76 and 77 expose P+ regions 73 and 74. Conductive material 78 and 79 which may be, for example, polysilicon or aluminum, make ohmic contact with P+ regions 73 and 74 respectively through openings 76 and 77. P+ regions 73 and 74 may be long strips having a uniform width to act as the drain and source for many transistors in addition to memory transistors 67-69. Memory transistors 67-69 have a gate electrode 80-82 respectively, made of conductive material such as polysilicon or metallization. Each memory transistor 67-69 has a variable threshold region 83-85 respectively and a fixed threshold region 86-88 respectively separating variable threshold regions 83-85 from P+ region 73. Additional fixed threshold regions 89-91 associated with memory transistors 67-69 respectively function to separate variable threshold regions 83-85 from P+ region 74.

Figure 20:
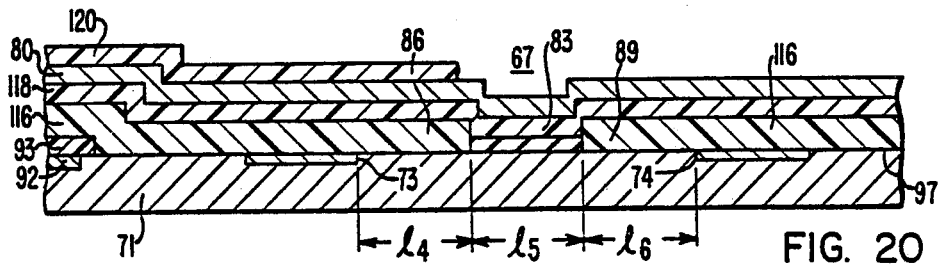
FIGS. 10–20 are cross-section views along the lines XX—XX of FIG. 1 during alternate method steps of this invention.
Figure 10:
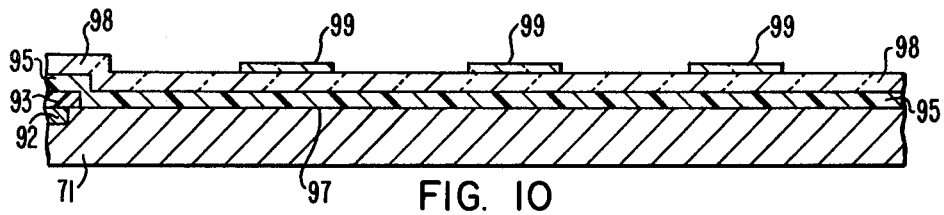
Figure 11:
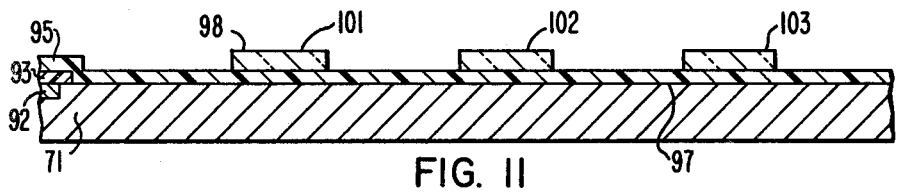

FIGS. 10-19 illustrate a cross-section view after various steps are performed in fabricating memory array 66 as shown in FIG. 9. FIG. 20 is a cross-section view along the lines XX—XX of FIG. 9. Referring to FIG. 10, semiconductor substrate 71 which may be, for example, silicon has a field implant 92 of N type material in substrate 71 in selected areas around memory array 66. The field implant which may be formed by suitable masking and ion implantation or diffusion has the effect of raising the threshold voltage $V_T$ of substrate 71 in region of field implant 92. The higher threshold voltage prevents inversion layers from being formed in substrate 71 when signal and voltage lines are routed above.

A field oxide 93 is formed above field implant 92 having a thickness of 8,000 to 10,000 Angstroms. The field oxide 93 is formed in the selected areas using suitable masking techniques well known in the art.

Figure 12:
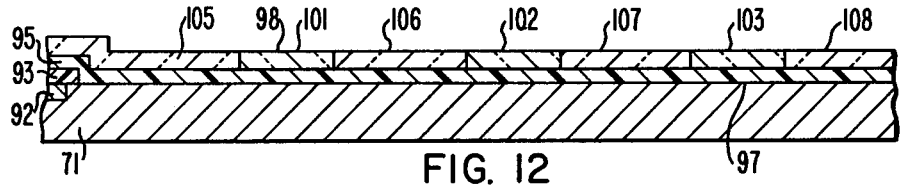

In the region of memory array 66, substrate 71 has a layer of oxide 95 formed on its upper surface 97. Oxide layer 95 may, for example, be 800 Angstroms thick and functions to act as a stop during a subsequent plasma etch step. Above oxide layer 95 is silicon nitride layer 98 which may for example be 3,000 Angstroms thick. A layer of material suitable for a mask is deposited on silicon nitride layer 98 and selectively etched to form mask 99 in the regions where the drain and source of memory transistor 67 is formed and in the region where variable threshold region 83 is to be formed. Silicon nitride layer 98 is subsequently etched such as by plasma etching to remove silicon nitride layer 98 in all regions except below mask 99. Mask 99 is subsequently removed leaving silicon nitride regions 101-103 shown in FIG. 11. Additional silicon oxide 105-108 is grown above silicon oxide layer 95. Silicon oxide regions 105-108 may be 3,000 Angstroms thick which would fill the spaces between silicon nitride regions 101-103 as shown in FIG. 12.

Figure 13:
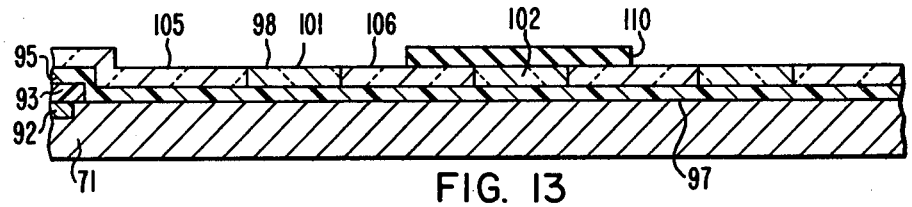
Figure 14:
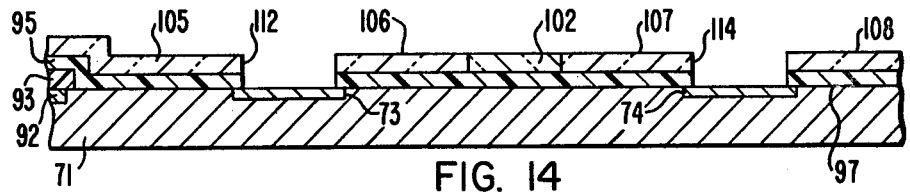

A mask 110 is deposited over silicon nitride region 102 and portions of silicon oxide regions 106 and 107 to protect silicon nitride region 102 from being etched. Mask 110 is shown in FIG. 13. Silicon nitride regions 101 and 103 are etched such as by plasma etching to provide openings 112 and 114 as shown in FIG. 14. Silicon oxide layer 95 below silicon nitride regions 101 and 103 is likewise etched to complete the opening to upper surface 97 of silicon substrate 71. Mask 110 may be removed. Mask 110 may be, for example, a photoresist.

P+ impurities may subsequently be diffused through openings 112 and 114 to form P+ regions 73 and 74 shown in FIG. 14. As shown in FIG. 14 the P+ diffusion forming regions 73 and 74 may have a side diffusion which may be for example 1.5 micrometers.

Figure 15:
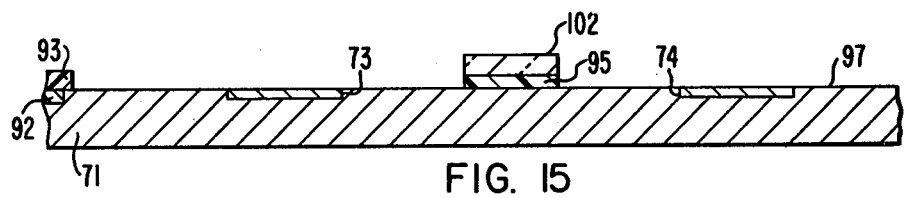
Figure 16:
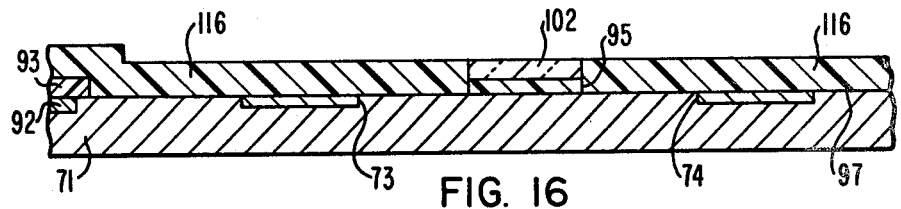
Figure 17:
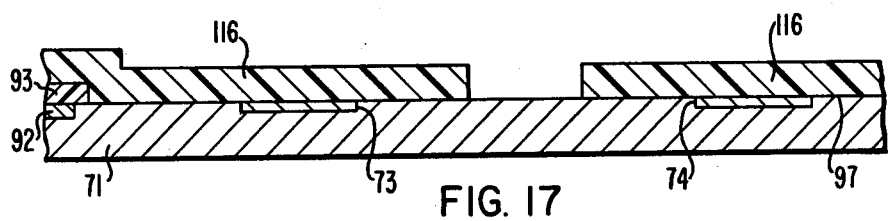

Silicon oxide regions 105-108 and silicon oxide layer 95 are subsequently stripped or removed from upper surface 97 of substrate 71 except for the silicon oxide layer 95 beneath silicon nitride 102 as shown in FIG. 15. A clean silicon oxide layer 116 is regrown over upper surface 97 of substrate 71 except in the region where silicon nitride 102 exists as shown in FIG. 16. Silicon nitride region 102 and silicon dioxide layer 95 below silicon nitride region 102 are stripped or etched from upper surface 97 as shown in FIG. 17.

Figure 18:
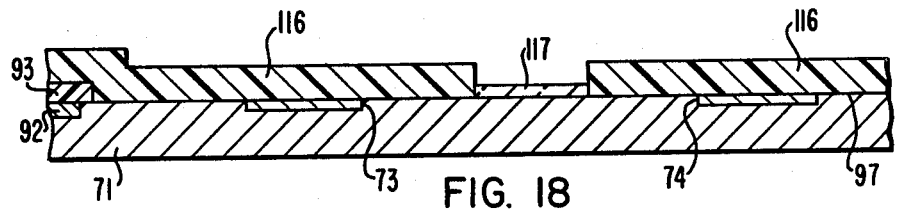

A clean silicon dioxide layer 117 is grown on an exposed upper surface 97 as shown in FIG. 18. The thickness of silicon dioxide layer 117 is adjusted to permit a variable threshold region 83 of memory transistor 67 to be formed.

Figure 19:
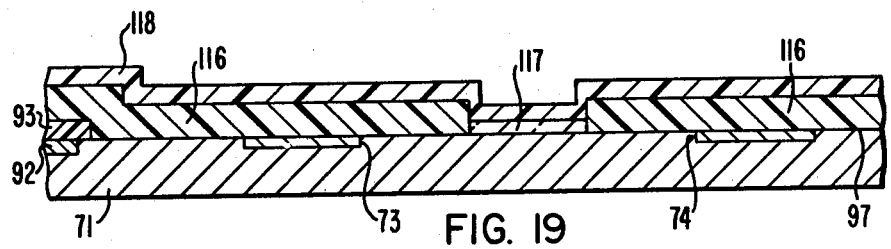

A silicon nitride layer 118 is deposited over silicon dioxide layer 116 and silicon dioxide layer 117 as shown in FIG. 19. The thickness of silicon nitride layer 118 is adjusted to provide a variable threshold region 83 and fixed threshold regions 86 and 89 on either side of variable threshold region 83, see FIG. 20. A layer of polysilicon or metal is deposited and etched to form gate electrodes 80-82 over silicon nitride layer 118 and contacts 78 and 79.

A layer 120 of dielectric material is deposited over silicon nitride layer 118 and gate electrodes 80-82. Layer 120 is formed using a low temperature process so as not to disturb the metallization or performance of the MNOS transistors. Layer 120 may be formed by the chemical vapor deposition of silicon oxide known as SILOX. Layer 120 functions to form a conformal coating over memory array 66 and especially to fill the spaces between the gate electrodes 80-82.

As shown in FIG. 20 and FIG. 9 memory transistor 67 comprises a drain 73 and source 74 which may be interchangeable having a gate electrode 80 with a fixed threshold region 86, a variable threshold region 83 and a fixed threshold region 89. Fixed threshold regions 86 and 89 are positioned on either side of variable threshold region 83.

It is understood that N type material may be substituted for P type material and that P type material may be substituted for N type in the embodiments of FIGS. 1 through 20 to form memory array 10 or 66 of N channel MNOS transistors in place of the P channel MNOS transistors.

Figure 21:
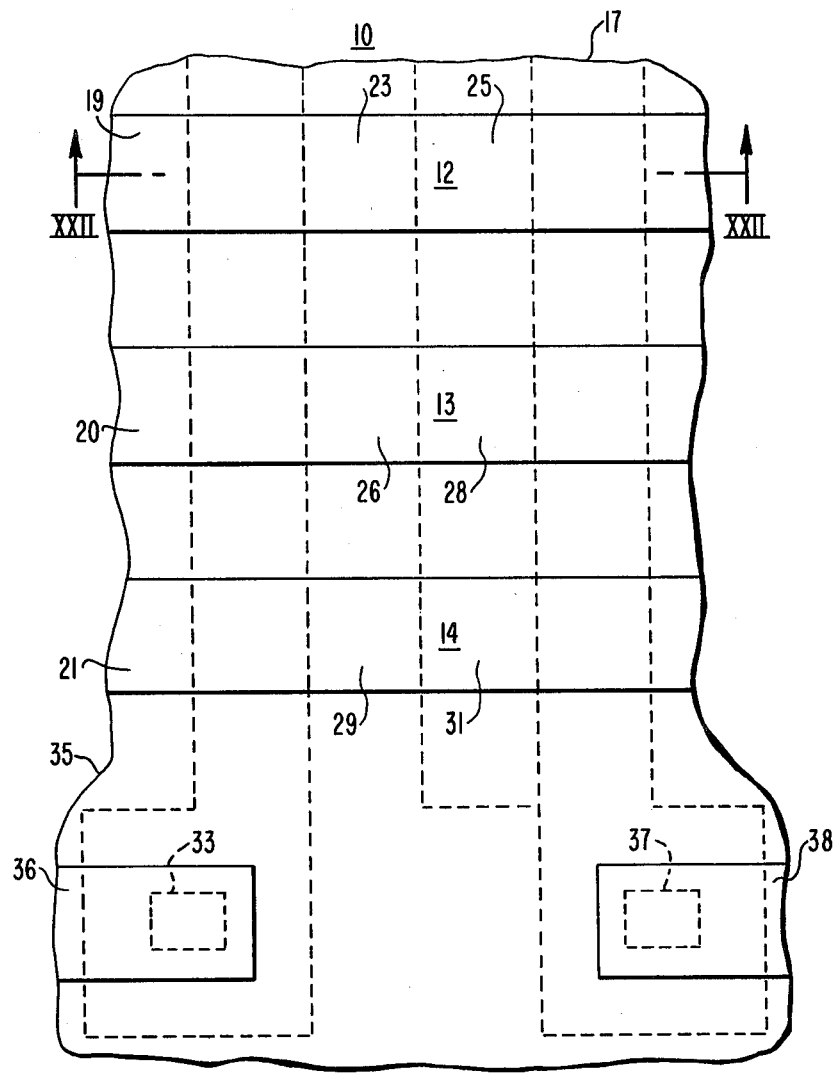
FIG. 21 is a top view of an array of variable threshold transistors.
Figure 22:
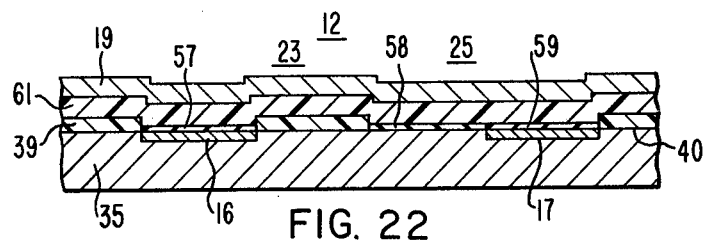
FIG. 22 is a cross-section view along the lines XXII—XXII of FIG. 21.

It is further understood that the variable threshold region may be self-aligned with respect to just one drain or source region of the MNOS transistor. This may be achieved by merging openings 46 and 47 shown in FIG. 3 by removing the silicon oxide layer 39 and silicon nitride layer 43 therebetween. The edge of memory protect mask 49 shown in FIG. 4 would define the transition from the variable threshold region 25 and P+ region 17. $I_3$ in FIG. 8 would therefore be zero and fixed threshold region 24 would be eliminated. The resulting structure is shown in FIGS. 21 and 22. In FIGS. 21 and 22, like references are used for functions corresponding to the apparatus of FIG. 1.

In processing if silicon nitride is to be chemically etched, best practice is to use a mask of silicon oxide material as opposed to photoresist which is not preferred. The silicon oxide could remain to form part of the structure or be removed. If a step using plasma etch is called for, a suitable photoresist may be used.

A self-aligned variable threshold region between a drain and source of a memory transistor has been described. It offers the advantages of higher density memory arrays with better wafer-to-wafer uniformity without the need for additional processing masks. The higher density memory arrays are achieved by positioning the drain and source closer together without the need for providing alignment tolerances for the variable threshold region. The closer spacing between the drain and source provide higher speed detection because of the shorter channel of the fixed threshold regions of the memory transistors which presently limit the current passing through the transistor, particularly in the high conductance state. Along with the higher transconductance $g_m$ there is a larger $\Delta g_m$ between the high and low conductance states because the variable threshold region has greater control over the current since the channel length of the variable threshold region is much longer than the channel length of the fixed threshold regions.

A method for self-aligning the variable threshold region between the drain and source of a memory transistor has been described. In fabricating the memory transistors alignment tolerances between the drain and source and variable threshold region are eliminated by forming openings in a dielectric material for all three at the same time. A protect mask or implant barrier over the desired variable threshold region opening isolates the region during diffusion or ion implantation through openings for the drain and source regions. Subsequent processing permits formation of the silicon oxide and silicon nitride layers for the variable threshold region.

We claim:

1. A method for self-aligning the variable threshold region between the drain and source of a memory transistor comprising the steps of:
    forming a first layer of silicon oxide over a semiconductor substrate of silicon,
    forming a second layer of silicon nitride over said first layer of silicon oxide,
    forming first, second and third openings spaced apart through the first and second layers for the drain, variable threshold, and source regions respectively, of the transistor,
    depositing first material suitable to form an implant barrier over said second opening region,
    ion implanting impurities through said first and third openings to form the drain and source regions of the transistor,
    removing said first material from above the second opening,
    growing thermal oxide on the semiconductor substrate in the first, second and third openings,
    forming a third layer of silicon nitride over the wafer,
    forming fourth and fifth openings through the third layer of silicon nitride and thermal oxide to the drain and source regions respectively,
    depositing conductive material over the third layer of silicon nitride and fourth and fifth openings, and
    etching said conductive material to form drain and source contacts and a gate electrode overlying a path on said third layer from said drain region over said second opening to said source region.

2. A method for self-aligning the variable threshold region between the drain and source of a memory transistor comprising the steps of:
    forming a first layer of silicon oxide over a semiconductor substrate of silicon,
    forming a second layer of silicon nitride over said first layer of silicon oxide,
    forming first, second and third openings spaced apart through the first and second layers for the drain, variable threshold, and source regions respectively, of the transistor,
    depositing first material suitable to form an implant barrier over said second opening region, ion implanting impurities through said first and third openings to form the drain and source regions of the transistor, removing said first material from above the second opening, removing said second layer of silicon nitride, growing thermal oxide on the semiconductor substrate in the first, second and third openings, forming a third layer of silicon nitride over said thermal oxide and said first layer of silicon oxide, forming fourth and fifth openings through the third layer of silicon nitride and thermal oxide to the drain and source regions respectively, depositing conductive material over the third layer of silicon nitride and fourth and fifth openings, and etching said conductive material to form drain and source contacts and a gate electrode overlying a path on said third layer from said drain region over said second opening to said source region.

3. The method of claim 1 wherein said step of growing thermal oxide includes growing to a thickness of 20 to 400 Angstroms.

4. The method of claim 1 wherein said step of depositing first material includes depositing photoresist.

5. The method of claim 1 wherein said step of depositing first material includes depositing polyimide material.

6. The method of claim 1 wherein said step of forming a first layer of silicon oxide includes forming to a thickness of at least 800 Angstroms.

7. The method of claim 1 wherein said step of depositing conductive material includes depositing aluminum.

8. The method of claim 1 wherein said step of depositing conductive material includes depositing polycrystalline silicon.

9. The method of claim 1 wherein said step of forming first, second and third openings includes spacing the first and third openings apart by at most 9 micrometers.

10. A method for self-aligning the variable threshold region between the drain and source of each memory transistor of a plurality of memory transistors comprising the steps of:

forming a first layer of silicon oxide over a semiconductor substrate of silicon, forming a second layer of silicon nitride over said first layer of silicon oxide, forming first, second, and third openings spaced apart and longitudinally parallel to one another through the first and second layers for the drain, variable threshold region and source regions respectively of the plurality of memory transistors, depositing first material suitable to form an implant barrier over said second opening, ion implanting impurities through said first and third openings to form the drain and source regions of the plurality of memory transistors, removing said first material from above the second opening, growing thermal oxide on the semiconductor substrate in the first, second, and third openings, forming a third layer of silicon nitride over said thermal oxide and said second layer of silicon nitride, forming fourth and fifth openings through the third layer of silicon nitride and thermal oxide to the drain and source regions respectively, depositing conductive material over the third layer of silicon nitride and fourth and fifth openings, and etching said conductive material to form a drain and source contact to said drain and source region and a plurality of spaced apart gate electrodes each overlying a path on said third layer from said drain region to said source region.

11. A method for self-aligning the variable threshold region between the drain and source of each memory transistor of a plurality of memory transistors comprising the steps of:

forming a first layer of silicon oxide over a semiconductor substrate of silicon, forming a second layer of silicon nitride over said first layer of silicon oxide, forming first, second, and third openings spaced apart and longitudinally parallel to one another through the first and second layers for the drain, variable threshold region and source regions respectively of the plurality of memory transistors, depositing first material suitable to form an implant barrier over said second opening, ion implanting impurities through said first and third openings to form the drain and source regions of the plurality of memory transistors, removing said first material from above the second opening, removing said second layer of silicon nitride, growing thermal oxide on the semiconductor substrate in the first, second, and third openings, forming a third layer of silicon nitride over said thermal oxide and said first layer of silicon oxide, forming fourth and fifth openings through the third layer of silicon nitride and thermal oxide to the drain and source regions respectively, depositing conductive material over the third layer of silicon nitride and fourth and fifth openings, and etching said conductive material to form a drain and source contact to said drain and source region and a plurality of spaced apart gate electrodes each overlying a path on said third layer from said drain region to said source region.

12. The method of claim 10 or 11 wherein said step of forming first, second and third openings include forming rectangular openings.

13. The method of claim 10 or 11 wherein said step of etching includes etching rectangular gate electrodes.

14. A method for providing a self-aligned variable threshold region between the drain and source of a memory transistor comprising the steps of:

forming a first layer of silicon oxide over a semiconductor substrate of silicon, forming a second layer of silicon nitride over said first layer of silicon oxide, etching portions of the second layer to leave first, second and third regions of said second layer spaced apart and positioned over the respective area desired for the drain region, variable threshold region, and source region of the memory transistor, forming a third layer of oxide over the exposed first layer in areas not masked by said first, second and third regions of said second layer of silicon nitride, depositing first material suitable to form a protective mask over said second region of said second layer, removing the first and third regions of said second layer, removing the first layer of silicon oxide underneath said first and third regions, removing said first material over the variable threshold region, diffusing impurities into the exposed semiconductor substrate underneath the location of the first and third regions to form the drain and source regions, respectively, forming a fourth layer of oxide above the drain and source regions, removing the second region of said second layer of silicon nitride and the first layer of silicon oxide underneath said second region, forming a fifth layer of oxide in the variable threshold region, forming a sixth layer of silicon nitride over the wafer, opening windows for contact to the drain and source regions, depositing conductive material over the wafer, and etching the conductive material to form drain and source contacts and a gate electrode.

15. The method of claim 14 further including after the step of diffusing removing said third layer of oxide, removing said first layer of oxide exposed by the removal of said third layer, said step of forming a fourth layer of oxide includes forming said oxide on the semiconductor substrate over the area exposed by the removal of said first layer.

16. The method of claim 14 wherein said step of forming a first layer of silicon oxide includes forming to a thickness of at least 800 Angstroms.

17. The method of claim 14 wherein said step of forming a second layer of silicon nitride includes forming to a thickness of at least 3,000 Angstroms.

18. The method of claim 14 wherein said step of etching the second layer includes plasma etching.

19. A method for self-aligning the variable threshold region with respect to the source of a memory transistor comprising the steps of:

forming a first layer of silicon oxide over a semiconductor substrate of silicon, forming a second layer of silicon nitride over said first layer of silicon oxide, forming first, and second openings spaced apart through the first and second layers, depositing first material suitable to form an implant barrier over a portion of said second opening nearest said first opening, ion implanting impurities through said first opening and said second opening where not covered by said first material to form the source and drain regions, respectively, of the transistor, removing said first material from above the portion of the second opening, growing thermal oxide on the semiconductor substrate in the first and second openings, forming a third layer of silicon nitride over the wafer, forming third and fourth openings through the third layer of silicon nitride and thermal oxide to the source and drain regions respectively, depositing conductive material over the third layer of silicon nitride and third and fourth openings, and etching said conductive material to form source and drain contacts and a gate electrode overlying a path on said third layer from said drain region over said portion of said second opening to said source region.

20. The method of claim 1 wherein said step of forming fourth and fifth openings includes depositing a fourth layer of silicon oxide over said third layer of silicon nitride and selectively removing portions of said fourth layer where said fourth and fifth openings are desired.

21. The method of claim 10 wherein said step of forming fourth and fifth openings includes depositing a fourth layer of silicon oxide over said third layer of silicon nitride and selectively removing portions of said fourth layer where said fourth and fifth openings are desired.

* * * * *